United States Patent
Huang

[19]

[11] Patent Number: 5,983,311
[45] Date of Patent: Nov. 9, 1999

[54] SEQUENTIAL MEMORY ACCESSING CIRCUIT AND METHOD OF ADDRESSING TWO MEMORY UNITS USING COMMON POINTER CIRCUIT

[75] Inventor: Cheng-Yen Huang, Hsinchu, Taiwan

[73] Assignee: United Microelectronics Corp., Hsinchu, Taiwan

[21] Appl. No.: 08/872,667

[22] Filed: Jun. 11, 1997

[30] Foreign Application Priority Data

Oct. 21, 1996 [TW] Taiwan .................................. 85216208

[51] Int. Cl.[6] ...................................................... G06F 12/02
[52] U.S. Cl. .......................... 711/102; 711/104; 711/218; 711/219
[58] Field of Search .................................. 711/218, 219, 711/148, 102, 104

[56] References Cited

U.S. PATENT DOCUMENTS 4,764,895  8/1988  Armstrong ............................... 711/218
5,469,566  11/1995  Hohenstein et al. ................ 395/182.04

Primary Examiner—Eddie P. Chan
Assistant Examiner—Hiep T. Nguyen
Attorney, Agent, or Firm—Pillsbury Madison & Sutro LLP

[57] ABSTRACT

A sequential memory access circuit for access to various memory units is provided. The sequential memory access circuit is coupled between an external system and at least two memory units including a RAM unit and a ROM unit. The sequential memory access circuit includes a common data pointer circuit, responsive to a reset signal, a write request signal, and a read request signal from said external system, for generating accordingly a RAM enable signal, a ROM enable signal, and a counter signal, for control of the access to the RAM unit and the ROM unit. Further, a length register is used to generate a bound control signal to said common data pointer circuit in response to the write request signal and the counter signal. A sequential access dedicated comparator is used to provide the controls for the access to the two memory units. The structure of the sequential memory access circuit allows for a small circuit layout area and a reduced delay time.

12 Claims, 4 Drawing Sheets

SEQUENTIAL MEMORY ACCESSING CIRCUIT AND METHOD OF ADDRESSING TWO MEMORY UNITS USING COMMON POINTER CIRCUIT

BACKGROUND OF THE INVENTION

1. Field of the Invention

This invention relates to access methods for computer memories, and more particularly, to a sequential memory access method and circuit which utilizes a single data pointer for control of the access to various memory units including, for example, a RAM unit and a ROM unit.

2. Description of Related Art

In memory devices with limited address/port provisions, the access methods are usually based on sequential memory schemes so as to save precious area on the circuit board. This will allow the computer system developer to have a large system space to put various components therein. Such sequential memory schemes include, for example, the PnP (Plug and Play) bus protocol specified by ISA (Industrial Standard Association). For efficient utilization of the limited area on the circuit board, the sequential memory circuit includes a RAM unit for storing volatile data, and a ROM unit for storing permanent data that are repeatedly used by the system. Such a conventional sequential memory system is composed of the following components:

(1) At least one RAM unit and one ROM unit, in which the RAM unit is used to store volatile data and the ROM unit is used to store permanent data.

(2) At least two data pointers, which are respectively used to address the RAM unit and the ROM unit. The value of each of the two data pointers will be increased by one after each access to the respective memory unit is completed.

(3) One length register, which is to record the length of the data to be written to or read from the RAM unit, and is also used to control the variation in the length of data stored in the RAM unit.

(4) One comparator, which is used to compare the contents of the length register and the RAM data pointer to determine whether the current access operation is being directed to the RAM unit or to the ROM unit. For example, when the RAM data pointer is greater in value than the length register, the current access operation is being directed to the ROM unit; otherwise the RAM unit is being accessed.

The foregoing system, however, has several drawbacks. First, the RAM unit and the ROM unit cannot be accessed at the same time, but two data pointers are used. Second, the use of two data pointers causes the system to be complex and less efficient. Third, there is a delay time in the comparator which causes a reduction to the overall system performance. The foregoing system will be described in more detail in the following with reference to FIG. 1.

Referring to FIG. 1, there is shown a schematic circuit diagram of a conventional sequential memory access circuit which allows an external system 10 to perform an access (Read/Write) operation on various memory units including, for example, a RAM unit 13 and a ROM unit 14. This sequential memory access circuit includes a RAM data pointer circuit (Y) 11, a ROM data pointer circuit 12, a comparator (X-Y) 15, a length register (X) 16, a Write_Data bus which is used to transfer data from the external system 10 to the RAM unit 13 and the length register (X) 16, and a Read_Data bus which is used to transfer data from the RAM unit 13 and the ROM unit 14 to the external system 10. The external system 10 issues three control signals including RESET (reset signal), $\overline{\text{Read}}$ (read request signal), and $\overline{\text{Write}}$ (write request signal) to the RAM data pointer circuit 11 for control of the access operation to the RAM unit 13 and the ROM unit 14.

At first, the external system 10 issues the RESET signal to set the pointer value in the RAM data pointer circuit 11 and the ROM data pointer circuit 12 to zero so as to initiate a sequential access operation to the RAM unit 13 or the ROM unit 14. When the external system 10 reads data from the RAM unit 13 and ROM unit 14, for example, it sets $\overline{\text{Read}}$ at a LOW voltage, and the accessed data will be put on the Read_Data bus for the external system 10 to fetch data from the same. On the other hand, when the external system 10 wants to write data into the RAM unit 13, it sets $\overline{\text{Write}}$ at a LOW voltage and puts the data on the Write_Data bus, which causes the data on the Write_Data bus to be written into selected areas of the RAM unit 13. At the same time, the content X of the length register 16 and the current pointer value Y of the RAM data pointer circuit 11 are forwarded to the comparator 15 which compares the two inputs X, Y to thereby generate an output in accordance with the following criteria:

(A) If X>Y, the output of the comparator 15 will update the pointer value of the RAM data pointer circuit 11 in accordance with the states of $\overline{\text{Read}}$ and $\overline{\text{Write}}$.

At this time, the ROM data pointer circuit 12 is disabled, while the access operation to the RAM unit 13 is enabled.

(B) If X≦Y, the output of the comparator 15 update the pointer value of the ROM data pointer circuit 12 in accordance with the state of $\overline{\text{Read}}$. At this time, the RAM data pointer circuit 11 is disabled.

One major drawback of the foregoing sequential memory access circuit, however, is that the RAM data pointer circuit 11 and the ROM data pointer circuit 12 cannot operate at the same time. This causes the use of extra hardware that significantly increases the manufacturing costs of the sequential memory access circuit. Moreover, since the comparator 15 is built with adders and subtractors, it requires a large circuit layout area to implement, and the data processing rate is low due to a delay time inherent to such a construction.

SUMMARY OF THE INVENTION

It is therefore a primary objective of the present invention to provide a sequential memory access method and circuit which is provided with a common data pointer for control of the access to both the RAM unit and the ROM unit.

It is another objective of the present invention to provide a sequential memory access method and circuit which includes a comparator having a small circuit layout area and a reduced delay time compared to the prior art.

In accordance with the foregoing and other objectives of the present invention, a new and improved sequential memory access method and circuit is provided. The sequential memory access circuit is coupled between an external system and at least two memory units including a RAM unit and a ROM unit. It includes a common data pointer circuit for generating a counter signal, a RAM enable signal, and a ROM enable signal in response to a reset signal, a write request signal, and a read request signal from the external system for control of the access to the RAM unit and the ROM unit. Further, a length register is capable of generating a bound control signal in response to the write request signal and the counter signal. The RAM unit transfers data to and from the external system via the $\overline{\text{Read}}$ bus and $\overline{\text{Write}}$ bus in response to the read/write request signal from the external system and the RAM enable signal and the counter signal from the common data pointer circuit. The ROM unit transfers data to the external system via the read-data bus in response to the ROM enable signal and the counter signal from the common data pointer circuit.

The foregoing sequential memory access circuit has the advantage of allowing for a small layout area and fewer circuit elements on the circuit board while enhancing the system performance.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
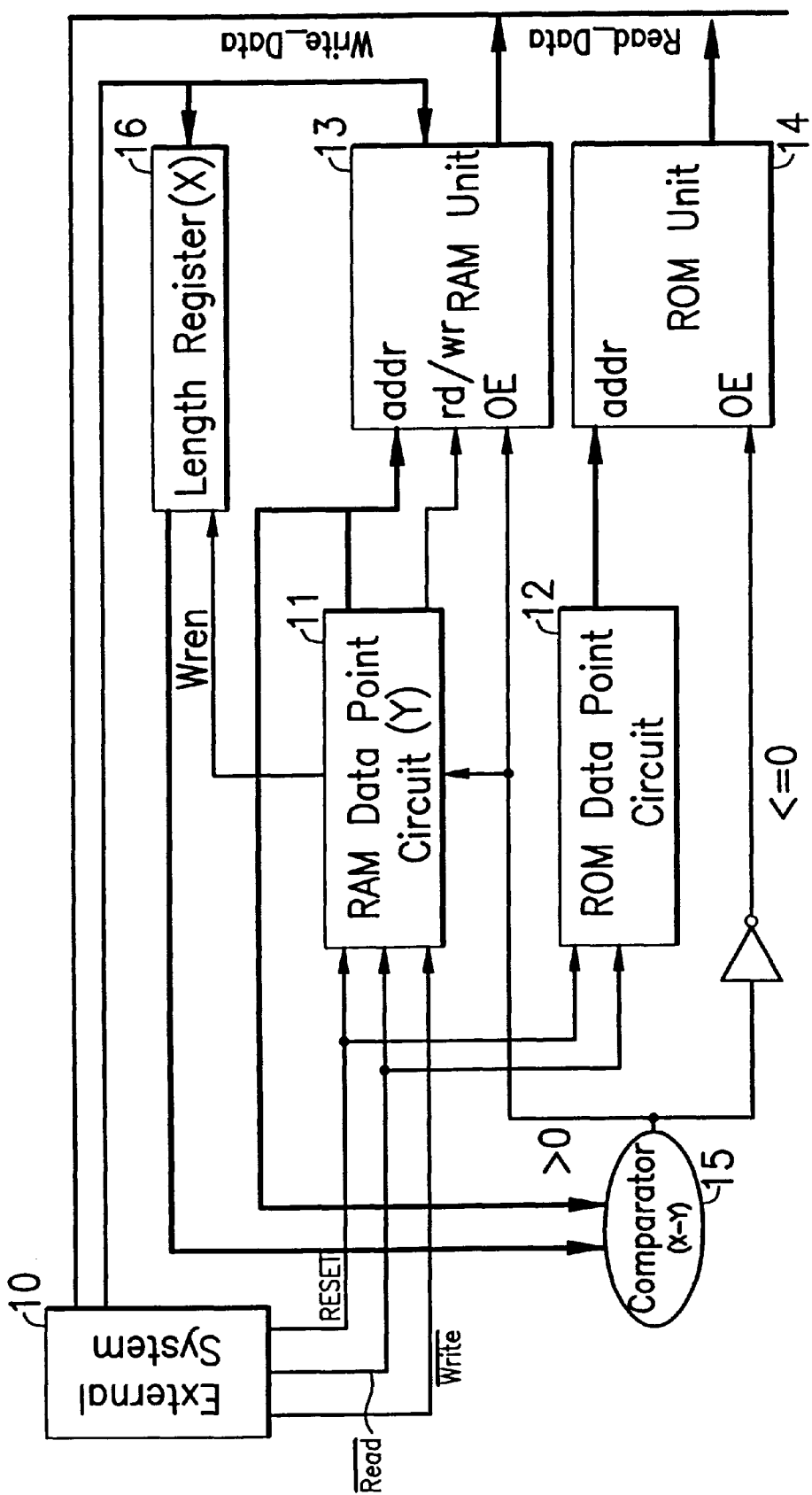
FIG. 1 is a schematic diagram of a conventional sequential memory access circuit.
Figure 2:
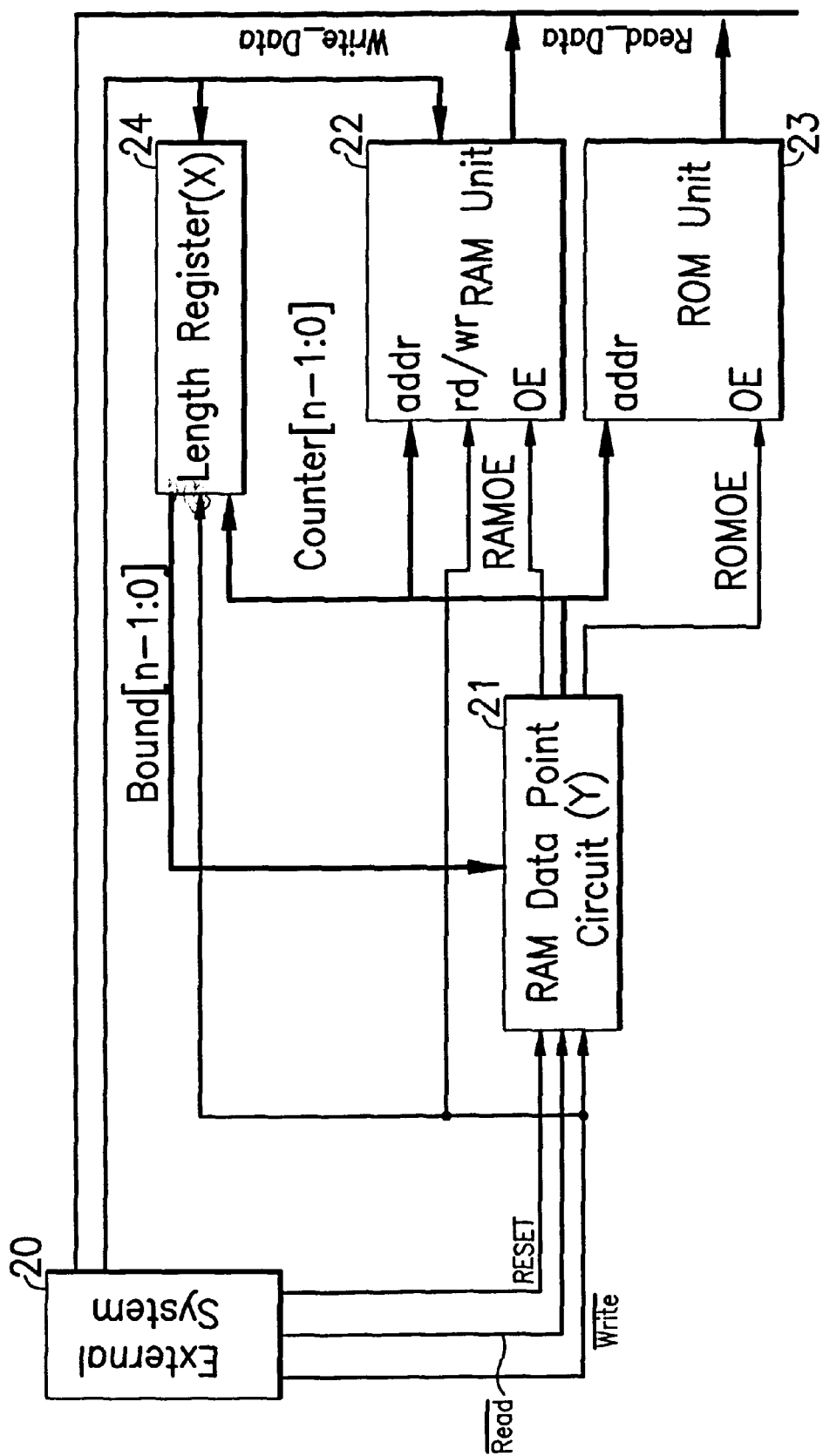
FIG. 2 is a schematic diagram of the sequential memory access circuit according to the present invention.

Referring to FIG. 2, there is shown a schematic diagram of the sequential memory access circuit according to the present invention, which allows an external system 20 to perform an access (Read/Write) operation on a RAM unit 22 and a ROM unit 23. This sequential memory access circuit includes a common data pointer circuit (Y) 21, a length register (X) 24, a write data bus (hereinbelow, abbreviated as Write_Data bus) which is used to transfer data into the RAM unit 22 and the length register 24, and a read data bus (hereinbelow, abbreviated as Read_Data bus) which is used to transfer data from the RAM unit 22 and ROM unit 23 to the external system 20. The external system 20 issues three control signals including RESET (reset signal), $\overline{\text{Read}}$ (read request signal), and $\overline{\text{Write}}$ (write request signal) for control of the access operation to the RAM unit 22 and the ROM unit 23. It is a characteristic feature of this sequential memory access circuit that the common data pointer circuit 21 alone is used for control of the sequential access to both of the RAM unit 22 and ROM unit 23. Therefore, the RAM unit 22 and ROM unit 23 share one common data pointer represented by the common data pointer circuit 21.

At first, the external system 20 issues the RESET signal to set the pointer value Y in the common data pointer circuit 21 to zero so as to initiate a sequential access operation to the RAM unit 22 and ROM unit 23. When the external system 20 wants to read data from the RAM unit 22 and ROM unit 23, for example, it sets $\overline{\text{Read}}$ at a logic-0 LOW voltage, and the accessed data will be put on the Read_Data bus for the external system 20 to fetch from the same. However, when the external system 20 wants to write data into the RAM unit 23, it sets $\overline{\text{Write}}$ at a logic-0 LOW voltage and puts the data on the Write_Data bus, which causes the data to be written into selected areas of the RAM unit 23. In this embodiment, $\overline{\text{Read}}$ and $\overline{\text{Write}}$ are both set at a logic-1 HIGH voltage when no Read/Write operation is to be performed.

As shown in FIG. 2, the common data pointer circuit 21 updates the value of Counter[n−1:0] in accordance with the states of RESET, $\overline{\text{Read}}$, $\overline{\text{Write}}$, and Bound[n−1:0]. If access to the RAM unit 22 is desired, the common data pointer circuit 21 issues the RAM enabling signal RAMOE to the RAM unit 22; whereas if access to the ROM unit 23 is desired, it issues the ROM enabling signal ROMOE to the ROM unit 23. The updated Counter[n−1:0] value is transferred concurrently via three paths respectively to the addr ports of the RAM and ROM units 22, 23 and to the length register 24. When RAMOE=1, it indicates that access to the RAM unit 22 is enabled; and when RAMOE=0, access to the same is disabled. Similarly, when ROMOE=1, it indicates that access to the ROM unit 23 is enabled; and when ROMOE=0, access to the same is disabled.

When $\overline{\text{Write}}$=0, it indicates the external system 20 wants to write data into the RAM unit 22 or the length register 24; and when $\overline{\text{Write}}$=1, it indicates that no data is to be written into the same. When performing a data read operation, the RAM unit 22 and the ROM unit 23 both can put the addressed data on the Read_Data bus for the external system 20 to fetch. The length register 24 receives $\overline{\text{Write}}$ and Counter[n−1:0] as inputs to thereby generate an output denominated by Bound[n−1:0] which indicates the address range of data that are to be accessed. Moreover, the length register 24 receives data from the external system 20 also via the Write_Data bus.

Figure 3:
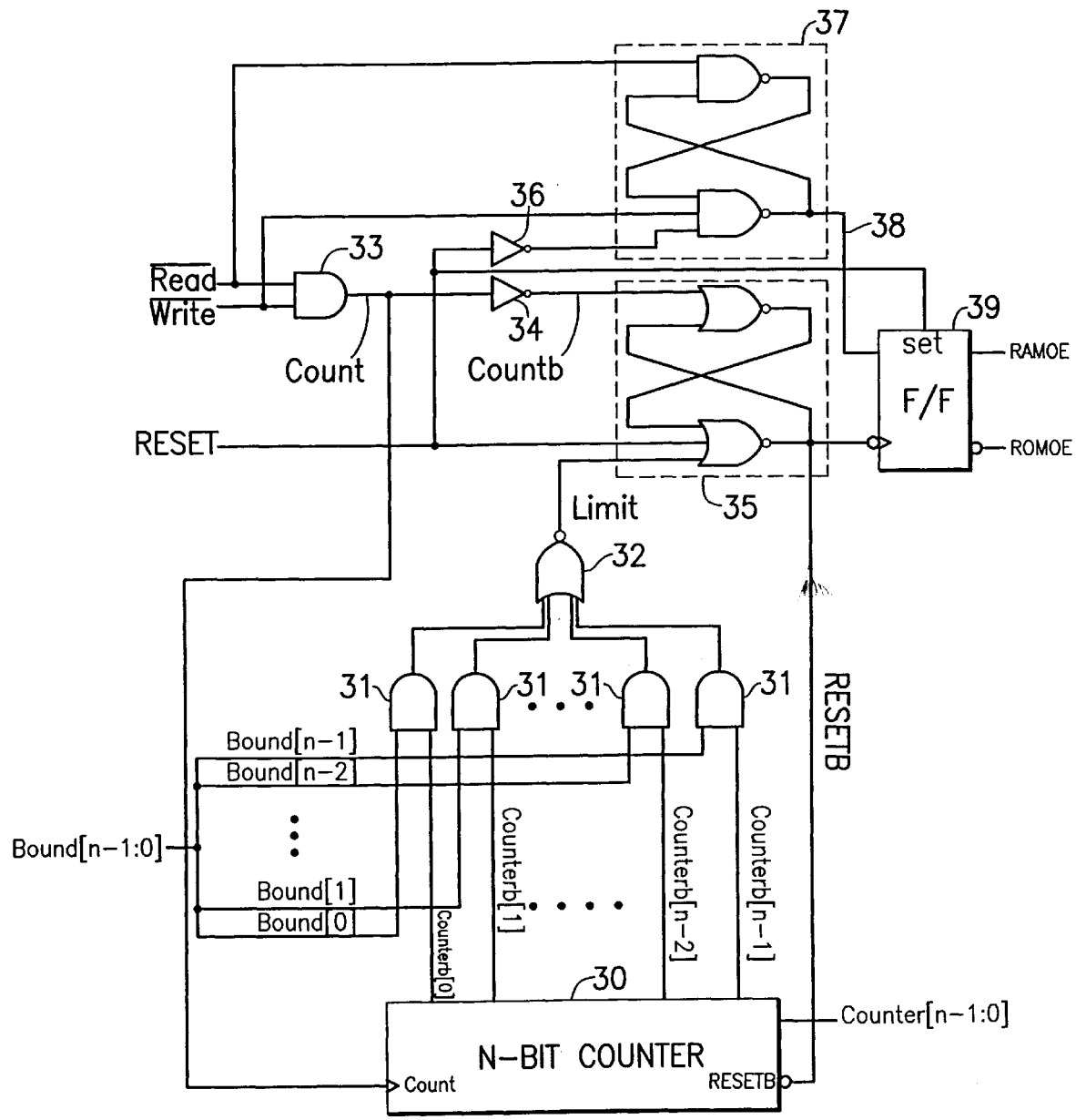
FIG. 3 is a detailed circuit diagram of a common data pointer circuit utilized in the sequential memory access circuit according to the present invention.

Referring to FIG. 3, there is shown a detailed circuit diagram of the common data pointer circuit 21 shown in FIG. 2. This common data pointer circuit 21 is composed of three major components: 1.) an N-bit counter 30, 2.) a sequential access dedicated comparator which is composed of a group of N AND gates 31 [0] to 31 [n−1] with one NOR gate 32, 3.) and a logic control unit which is composed of an AND gate 33, a pair of NOT gates 34, 36, a first S-R flip-flop 35, a second S-R flip-flop 37, and a D-type flip-flop 39. The structure and function of these three components are described respectively in the following.

When the N-bit counter 30 receives RESETB=0 (which is the 1's complement of the binary value of RESET), its output Counter[n−1:0] will be reset to zero. Further, when $\overline{\text{Read}}$=1 and $\overline{\text{Write}}$=1, the output of the AND gate 33 will initiate the N-bit counter 30 to start counting. The N-bit counter 30 has N output bits: Counterb[0], Counterb[1], . . . , Counterb[n−1], which are the 1's complements of Counter [n−1:0].

The N AND gates 31 [0] to 31 [n−1] and one NOR gate 32 in FIG. 3 in combination constitute a sequential access dedicated comparator for the common data pointer circuit 21. The N bits Bound[0], Bound[1], . . . , Bound[n−1] of the address bound value Bound[n−1:0] are paired with the output bits Counterb[0], Counterb[1], . . . , Counterb[n−1] of the N-bit counter 30 as the inputs to the N AND gates 31 [0] to 31 [n−1], respectively. When the N-bit counter 30 counts to a value equal to the value of Bound[n−1:0], the value of Counterb[n−1:0] will be exactly the complement of the value of Bound[n−1:0], thus causing all of the N AND gates 31 [0] to 31 [n−1] to output a logic-0 voltage and the subsequent NOR gate 32 to output a logic-1 voltage. The output of the NOR gate 32 is named Limit. Therefore, when Limit=1, it indicates that the current access operation is completed.

The $\overline{\text{Read}}$ and $\overline{\text{Write}}$ signals are connected to the AND gate 33 whose output (named Count) is connected to the Count port of the N-bit counter 30. At the same time, the Count signal is inverted by the NOT gate 34 whose output is named by Countb. The subsequent first S-R flip-flop 35 receives the Countb, RESET, and Limit signals as inputs to thereby generate an output named RESETB which is used to reset to the N-bit counter 30. Concurrently, the second S-R flip-flop 37 receives $\overline{\text{Read}}$, $\overline{\text{Write}}$, and the inversion of RESET as inputs to thereby generate an output 38. The D-type flip-flop 39 receives RESET, RESETB, and the output 38 of the second S-R flip-flop 37 as inputs. The two outputs of the D-type flip-flop 39, respectively named RAMOE and ROMOE, are used respectively to enable the access operation to the RAM unit 22 or the ROM unit 23.

When RESETB=0, the output Counter[n−1:0] of the N-bit counter 30 will be reset to zero. There are two conditions which will cause RESETB=0. These two conditions are (1) when RESET=1; (2) when Counterb[n−1:0] is the complement of Bound[n−1:0]; In the first condition, RESET=1 causes the S-R flip-flop 35 to generate RESETB=0 as its output. In the second condition, all of the N AND gates 31 [0] to 31 [n−1] will output a logic-0 voltage, which in turn causes the subsequent NOR gate 32 to output a logic-1 voltage, i.e., Limit=1. The condition of Limit=1 also causes the S-R flip-flop 35 to generate RESETB=0 as its output.

In the common data pointer circuit of FIG. 3, the RESET signal is initially set to logic-1 so as to cause the D-type flip-flop 39 to output RAMOE=1 and ROMOE=0, and also causes the first S-R flip-flop 35 to output RESETB=0. The condition of RESETB=0 resets the output Counter[n−1:0] of the N-bit counter 30 to zero. Thus, when the external system 20 issues the RESET signal, the common data point circuit 21 sets Counter [n−1:0], RAMOE and ROMOE to 0,1 and 0, respectively. Thereafter, the N-bit counter 30 starts to count when it receives RESET=0 at the Count port thereof. Initially, $\overline{\text{Read}}$=1 and $\overline{\text{Write}}$=1 which indicate that no access operation is to be performed on the RAM unit 22 or the ROM unit 23. When read operation is desired, the external system 20 issues $\overline{\text{Read}}$=0 to the common data pointer circuit 21, and when write operation is desired, $\overline{\text{Write}}$=0 is issued to the same.

Since read and write operations cannot be performed at the same time on the RAM unit 22, the condition of $\overline{\text{Read}}$=0 and $\overline{\text{Write}}$=0 at the same time is prohibited. Since there are two memory units, the RAM unit 22 and the ROM unit 23, there are three kinds of access operations that can be performed thereon: (1) a write operation on the RAM unit 22, (3) a read operation on the ROM unit 23; and (2) a read operation on the RAM unit 22. These three kinds of access operations are respectively described in details in the following.

(1) Initially, RESET=1, thus the D-type flip-flop 39 outputs RAMOE=1 and ROMOE=0. Therefore, N-bit counter will be reset, thus counter[n−1:0]=0 and counterb[n−1:0] will be a complement of "0". When Counter [n−1:0]=0, $\overline{\text{Write}}$=0, RAMOE=1 and data on the Write_Data bus, from the external system 20, is written into the length register 24. After the data on the Write_Data bus is written with the length register 24, the length register outputs Bound[n−1:0] to the common data point circuit 21. The common data point circuit 21 generates Counter [n−1:0], RAMOE and ROMOE to connected devices, such as the length register 24, the RAM unit 22 and the ROM unit 23. After RESET=0, while performing a write operation in the RAM unit 22, the external system 20 issues $\overline{\text{Write}}$=0, $\overline{\text{Read}}$=1 to the common data pointer circuit 21. Thus, writing to the RAM length register 24 and the RAM unit 22 can be performed. After reset signal goes from a logic-1 high voltage to a logic-0 low voltage, the write operation is therefore directed to the RAM unit 22.

(2) When the above RAM writing operation is finished, the D-type flip-flop 39 will keep RAMOE=1 and ROMOE=0. Thus, at this time while performing a read operation on the RAM unit 22, the external system 20 can issue $\overline{\text{Write}}$=1 and $\overline{\text{Read}}$=0 to the common data pointer circuit 21. The total number of RAM read operation in the RAM unit 22 is determined by the content of the RAM length register 24, that is written during the above RAM writing operation. Thus, the read operation is therefore directed to the RAM unit 22 until the content of the RAM length register 24 is reached.

(3) When the signals counter [n−1:0] of N-bit counter 30 reach the value of the RAM length register 24, signal limit will go from a logic-0 low voltage to a logic-1 high voltage. Then, N-bit counter will be reset, and the D-type flip-flop 39 will latch the output signal 38 (value is equal to "0") of the S-R flip-flop 37 and RAMOE=0, ROMOE=1 after that time. At this time, performing a read operation on the ROM unit 23, the external system 20 can issue $\overline{\text{Write}}$=1, $\overline{\text{Read}}$=0 to the common data pointer circuit 21. Now, the read operation is therefore directed to the ROM unit 23 only.

The sequential access dedicated comparator built by the N AND gates 31 [0] to 31 [n−1] and the NOR gate 32 operates in the following manner:

(1) Assume that:
the binary value of Bound[n−1:0] is a;
the binary value of Counterb[n−1:0] is b;
$\overline{0}$ represents the 1's complement of the binary value of 0 (n bits); and
$\overline{a}$ represents the 1's complement of the binary value of a (n bits).

(2) Since $a+\overline{a}=\overline{0}$, $a=\overline{0}-\overline{a}$ and $a-0=\overline{0}-\overline{a}$ Therefore, when Counter[n−1:0] is increased from zero to a value equal to the binary value a of Bound[n−1:0], the complement of Counter[n−1:0], i.e., Counterb[n−1:0], is decreased from $\overline{0}$ to $\overline{a}$.

(3) Since $a+\overline{a}=\overline{0}$ and $\overline{0} \geq b > \overline{a}$, $a+b > \overline{0}$.

Further, since a and b are both n-bit binary values, the addition thereof will cause an overflow. This overflow will occur only when the value of 1 appears at the same bit of the binary representation of a and b. Accordingly, it is required that $a \otimes b \neq 0$, where $\otimes$ is the AND operation on the bits of a and b.

Therefore, during the countdown of Counterb[n−1:0] from $\overline{0}$ to $\overline{a}$, at least one of the N AND gates 31 [0] to 31 [n−1], shown in FIG. 3, will output a logic-1 voltage, which in turn causes the subsequent NOR gate 32 to output a logic-0 voltage, i.e., Limit=0.

At the time when Counterb[n−1:0]=$\overline{a}$, $a \otimes b=0$ because Bound[n−1:0]=a at this time.

Therefore, when Counterb[n−1:0] is equal to $\overline{a}$, all of the N AND gates 31 [0] to 31 [n−1] will output a logic-0 voltage, which in turn causes the subsequent NOR gate 32 to output a logic-1 voltage, i.e., Limit=1, indicating that the access operation is completed.

The foregoing logic operation is implemented by the combination of the AND gates 31 [0] to 31 [n−1] and NOR gate 32 in FIG. 3 which is named sequential access dedicated comparator for the common data pointer circuit. Two major advantages can be benefited from the design of this sequential access dedicated comparator. First, the circuit is less complex than that of the prior art which utilizes adders and subtractors so that layout area is reduced. Second, the processing speed of this circuit is faster and more efficient than that of the prior art.

Figure 4:
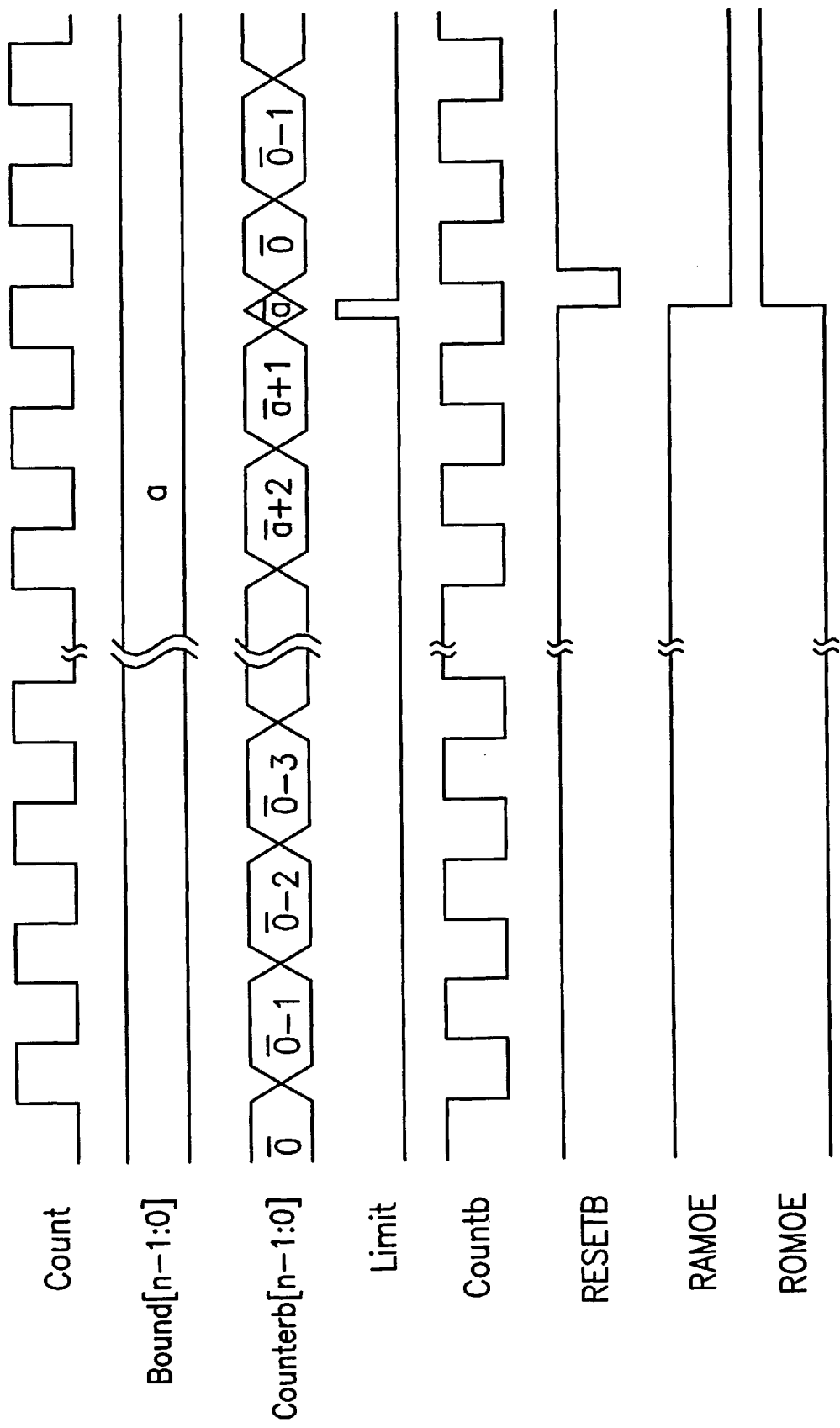
FIG. 4 shows a group of waveform diagrams of various control signals used in the data pointer of FIG. 3.

Referring further to FIG. 4, there is shown a group of waveform diagrams of various signals used in the data pointer 21 of FIG. 3, including Count, Bound[n−1:0], Counterb[n−1:0], Limit, Countb, RESETB, RAMOE, and ROMOE. As shown, when the value of Bound[n−1:0] is a, the initial value of Counterb[n−1:0] is $\overline{0}$. At the occurrence of one pulse to the Count port of the N-bit counter 30, Counterb[n−1:0] is decreased by one. At the time Counterb [n−1:0] equals to $\overline{a}$, Limit=1 appears. The first S-R flip-flop 35 receives Limit=1 and Countb (the 1's complement of Count) as inputs to thereby generate an output RESETB=0 which in turn resets the N-bit counter 30 to zero and also switches RAMOE from a logic-1 to a logic-0 voltage output and ROMOE from a logic-0 to a logic-1 voltage output, thus disabling the RAM unit 22 while enabling the ROM unit 23. After the N-bit counter 30 is reset to zero, Counterb[n−1:0] is restarted to count from $\overline{0}$ down to a value defined by the Bound[n−1:0] that causes Limit=1.

In conclusion, the invention provides several advantages over the prior art. First, a single common data pointer circuit, instead of two as in the prior art, can be used to control the access to two different memory units including one RAM unit and one ROM unit. Second, the comparator in the common data pointer circuit is composed of a plurality of AND gates and one NOR gate, which is not only faster in processing speed, but also allows the circuit layout to be smaller than the prior art whose comparator is implemented by adders and subtractors. These advantages allows the sequential memory access circuit of the invention to be small in circuit layout area and implemented with fewer circuit elements while enhancing the overall system performance.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A sequential memory access circuit coupled between an external system and at least two memory units including a RAM unit and a ROM unit, allowing said external system to access data, respectively, on said RAM unit and said ROM unit, said RAM unit and said ROM unit being connected to said external system via a write-data bus and a read-data bus for data transfer therebetween, said sequential memory access circuit comprising:
  a common data pointer circuit, responsive to a reset signal, a write request signal and a read request signal from said external system, for generating accordingly a counter signal, a RAM enable signal and a ROM enable signal, for control of an access to said RAM unit and said ROM unit; and
  a length register, receiving said write request signal, data from the write-data bus and said counter signal, for generating accordingly a bound control signal to said common data pointer circuit, wherein:
    said RAM unit transfers data to and from said external system via said write-data bus and said read-data bus in response to said write request signal and said read request signal from said external system and said RAM enable signal and said counter signal from said common data pointer circuit;
    said ROM unit transfers data to said external system via said read-data bus in response to said read request signal from said external system and said ROM enable signal and said counter signal from said common data pointer circuit; and
  said common data pointer circuit includes:
    a logic control circuit which receives said read request signal, said write request signal, and said reset signal from said external system as inputs;
    a counter, coupled to said logic control circuit, for generating a set of count bits under control of said logic control circuit; and
    a sequential access dedicated comparator, receiving said bound control signal from said length register and said count bits from said counter as inputs, for generating a limit signal indicative of an end of one access operation when a value of said count bits equals a value of said bound control signal,
  wherein
  said sequential memory access circuit performs a method for accessing said RAM unit and said ROM unit, said method comprising:
  (A) generating a count signal to said counter in response to said read request signal and said write request signal;
  (B) writing length data via said write-data bus into said length register to cause said length register to generate said bound control signal;
  (C) inputting said count signal to said counter to cause said counter to generate said set of count bits and a set of complementary count bits which is a complement of said set of count bits;
  (D) inputting said set of complementary count bits and said bound control signal to said sequential access dedicated comparator to cause said sequential access dedicated comparator to generate said limit signal;
  (E) inputting said count signal to said logic control circuit to cause said logic control circuit to generate a complementary count signal which is a complement of said count signal;
  (F) generating a complementary reset signal in accordance with a first logic operation on said complementary count signal, said reset signal and said limit signal;
  (G) generating an output control signal in accordance with a second logic operation on said read request signal, said write request signal and said complementary count signal; and
  (H) generating said RAM enable signal and said ROM enable signal in accordance with a third logic operation on said output control signal, said complementary reset signal and said reset signal.

2. The sequential memory access circuit of claim 1, wherein said sequential memory access circuit performs a read/write operation on said RAM unit and a read operation on said ROM unit, and when no access is requested, said write request signal and said read request signal are at a logic-1 state, and when a write operation is requested, said write request signal turns to a logic-0 state and when a read operation is requested, said read request signal turns to a logic-0 state.

3. The sequential memory access circuit of claim 2, wherein said write operation on said RAM unit comprises:
  (A) setting said reset signal to a logic-1 state so as to cause said RAM enable signal to be a logic-1 state, said ROM enable signal to be a logic-0 state, said complementary reset signal to be a logic-0 state, and said counter signal to be a logic-0 state;

(B) setting said reset signal to a logic-0 state so as to cause said write request signal to be a logic-0 state and said read request signal to be a logic-1 state;

(C) decreasing a value of said complementary count bits by 1 when said count signal is a logic-1 state, and thereafter switching said count signal to a logic-0 state;

(D) checking if said limit is a logic-1 state when said complementary count bits are equal to said bound control signal, if not, repeating said act (B) through said act (D);

(E) after said limit signal is a logic-1 state, checking if said complementary reset signal is a logic-0 state which causes said RAM enable signal to switch from a logic-1 state to a logic-0 state and said ROM enable signal to switch from a logic-0 state to a logic-1 state;

(F) if said complementary reset signal is a logic-0 state, converting said complementary count bits to a binary value of 0's complement; and (G) repeating said act (A) to said act (F) until said write operation to said RAM unit is completed.

4. The sequential memory access circuit of claim 2, wherein said read operation on said ROM unit comprises:

(A) maintaining said reset signal at a logic-0 state;

(B) setting said read request signal to a logic-0 state while maintaining said write request signal at a logic-1 state; and (C) setting said ROM enable signal to a logic-1 state while maintaining said RAM enable signal at a logic-0 state.

5. The sequential memory access circuit of claim 2, wherein said read operation on said RAM unit comprises:

(A) setting said reset signal at a logic-1 state;

(B) setting said read request signal to a logic-0 state while maintaining said write request signal at a logic-1 state; and (C) setting said RAM enable signal to a logic-1 state while maintaining said ROM enable signal at a logic-0 state.

6. The sequential memory access circuit of claim 1, wherein said logic control circuit includes a S-R flip-flop and a D-type flip-flop.

7. A sequential memory access circuit coupled between an external system and at least two memory units including a RAM unit and a ROM unit, allowing said external system to access data, respectively, on said RAM unit and said ROM unit, said RAM unit and said ROM unit being connected to said external system via a write-data bus and a read-data bus for data transfer therebetween, said sequential memory access circuit comprising:

a common data pointer circuit, responsive to a reset signal, a write request signal and a read request signal from said external system, for generating accordingly a counter signal, a RAM enable signal and a ROM enable signal, for control of an access to said RAM unit and said ROM unit; and a length register, receiving said write request signal, data from the write-data bus and said counter signal, for generating accordingly a bound control signal to said common data pointer circuit, wherein:

said RAM unit transfers data to and from said external system via said write-data bus and said read-data bus in response to said write request signal and said read request signal from said external system and said RAM enable signal and said counter signal from said common data pointer circuit;

said ROM unit transfers data to said external system via said read-data bus in response to said read request signal from said external system and said ROM enable signal and said counter signal from said common data pointer circuit; and said common data pointer circuit comprises:

a logic control circuit which receives said read request signal, said write request signal and said reset signal from said external system as inputs;

a counter, coupled to said logic control circuit, for generating a set of count bits under control of said logic control circuit; and a sequential access dedicated comparator, receiving said bound control signal from said length register and said count bits from said counter as inputs, for generating a limit signal indicative of an end of one access operation when a value of said count bits equals a value of said bound control signal, wherein said logic control circuit further comprises:

means for generating a count signal to said counter, in response to said read request signal and said write request signal;

means for receiving said count signal and generating a complementary counter signal which is a complement of said counter signal;

means for generating a complementary reset signal in accordance with a first logic operation on said complementary count signal, said reset signal, and said limit signal generated by said sequential access dedicated comparator;

means for generating an output control signal in accordance with a second logic operation on said read request signal, said write request signal and said complementary count signal; and means for generating said RAM enable signal and said ROM enable signal in accordance with a third logic operation on said output control signal, said complementary reset signal and said reset signal.

8. A sequential memory access circuit coupled between an external system and at least two memory units including a RAM unit and a ROM unit, allowing said external system to access data, respectively, on said RAM unit and said ROM unit, said RAM unit and said ROM unit being connected to said external system via a write-data bus and a read-data bus for data transfer therebetween, said sequential memory access circuit comprising:

a common data pointer circuit, responsive to a reset signal, a write request signal and a read request signal from said external system, for generating accordingly a counter signal, a RAM enable signal and a ROM enable signal, for control of an access to said RAM unit and said ROM unit; and a length register, receiving said write request signal, data from the write-data bus and said counter signal, for generating accordingly a bound control signal to said common data pointer circuit, wherein:

said RAM unit transfers data to and from said external system via said write-data bus and said read-data bus in response to said write request signal and said read request signal from said external system and said RAM enable signal and said counter signal from said common data pointer circuit;

said ROM unit transfers data to said external system via said read-data bus in response to said read request signal from said external system and said ROM enable signal and said counter signal from said common data pointer circuit; and said common data pointer circuit includes:
- a logic control circuit which receives said read request signal, said write request signal, and said reset signal from said external system as inputs;
- a counter, coupled to said logic control circuit, for generating a set of count bits under control of said logic control circuit; and
- a sequential access dedicated comparator, receiving said bound control signal from said length register and said count bits from said counter as inputs, for generating a limit signal indicative of an end of one access operation when a value of said count bits equals a value of said bound control signal, wherein:

said external system comprises means for writing length data via said write-data bus into said length register to cause said length register to generate said bound control signal, said logic control circuit comprises:
- means, responsive to said read request signal and said write request signal, for generating a count signal,
- means for inputting said count signal and generating a complementary count signal which is a complement of said count signal,
- means for generating a complementary reset signal in accordance with said complementary count signal, said reset signal and said limit signal,
- means for generating an output control signal in accordance with a second logic operation on said read request signal and said complementary count signal, and
- means for generating said RAM enable signal and said ROM enable signal in accordance with a third logic operation on said output control signal, said complementary reset signal and said reset signal;

said common data pointer circuit further comprises means for receiving said count signal and generating said set of count bits and a set of complementary count bits which is a complement of said set of count bits; and said sequential access dedicated comparator comprises means for inputting said set of complementary count bits and said bound control signal and generating said limit signal.

9. A method for accessing a RAM unit and a ROM unit by using a sequential memory access circuit including a common data pointer circuit and a sequential access dedicated comparator, said method comprising:

receiving a reset signal from an external system, said reset signal causing a set of counter bits to be set to zero;

writing length data from said external system into a length register via a write-data bus when said set of counter bits is equal to zero, said length register generating a bound control signal;

receiving one of a read request signal and a write request signal and generating a count signal;

inputting said count signal and generating a complementary count signal;

inputting said set of counter bits into a counter to cause said counter to generate said set of counter bits and a set of complementary counter bits;

inputting said set of complementary counter bits and said bound control signal to said sequential access dedicated comparator to cause said sequential access dedicated comparator to generate a limit signal;

generating one of a complementary reset signal in accordance with a first logic operation on said complementary count signal, said reset signal, and said limit signal;

generating an output control signal in accordance with a second logic operation on said read request signal, said write request signal and said complementary count signal; and generating one of a RAM enable signal and a ROM enable signal in accordance with a third logic operation on said output control signal, said complementary reset signal, and said reset signal.

10. The method according to claim 9, further comprising:

reading on said RAM unit;

writing on said RAM unit; and reading from said ROM unit, wherein:
- said writing on said RAM unit comprises:
  - setting said reset signal to a logic-1 state so as to cause said RAM enable signal to be a logic-1 state, said ROM enable signal to be a logic-0 state, said complementary reset signal to be a logic-0 state, and said counter signal to be a logic-0 state,
  - setting said reset signal to a logic-0 state so as to cause said write request signal to be a logic-0 state and said read request signal to be a logic-1 state;
  - decreasing a value of said set of complementary counter bits by 1 when said counter signal is a logic-1 state, and thereafter switching said counter signal to a logic-0 state;
  - checking if said limit is a logic-1 state when said complementary counter bits are equal to said bound control signal;
  - if said limit is not a logic-1 state, repeating said act of setting said reset signal to a logic-0 state through said act of checking if said limit is a logic-1 state;
  - after said limit signal is a logic-1 state, checking if said complementary reset signal is a logic-0 state which causes said RAM enable signal to switch from a logic-1 state to a logic-0 state and said ROM enable signal to switch from a logic-0 state to a logic-1 state, if said complementary reset signal is a logic-0 state, converting said complementary counter bits to a binary value of 0's complement; and repeating said act of setting said reset signal to a logic-1 state through said act of checking if said complementary reset signal is a logic-0 state, after said limit signal is a logic-1 state, until said write operation to said RAM unit is completed.

11. The method of claim 9, wherein said reading from said ROM unit comprises:

maintaining said reset signal at a logic-0 state;

setting said read request signal to a logic-0 state while maintaining said write request signal at a logic-1 state; and setting said ROM enable signal to a logic-1 state while maintaining said RAM enable signal at a logic-0 state.

12. The method of claim 9, wherein said reading on said RAM unit comprises:

setting said reset signal to a logic-1 state;

setting said read request signal to a logic-0 state while maintaining said write request signal at a logic-1 state; and setting said RAM enable signal to a logic-1 state while maintaining said ROM enable signal at a logic-0 state.

* * * * *